United States Patent
Hori et al.

(10) Patent No.: US 8,692,552 B2
(45) Date of Patent: Apr. 8, 2014

(54) GRADIENT FIELD POWER SUPPLY AND MAGNETIC RESONANCE IMAGING APPARATUS

(75) Inventors: Masashi Hori, Nasushiobara (JP); Motohiro Miura, Yaita (JP); Kazuhiro Hamaya, Tokyo (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 401 days.

(21) Appl. No.: 13/016,036

(22) Filed: Jan. 28, 2011

(65) Prior Publication Data

US 2011/0187370 A1 Aug. 4, 2011

(30) Foreign Application Priority Data

Jan. 29, 2010 (JP) .................................. 2010-019596
Jan. 26, 2011 (JP) .................................. 2011-013600

(51) Int. Cl.
*G01V 3/00* (2006.01)

(52) U.S. Cl.
USPC .......................................... 324/318; 324/322

(58) Field of Classification Search
USPC .................. 324/318, 322, 321, 300
See application file for complete search history.

(56) References Cited

U.S. PATENT DOCUMENTS

| | | | | |
|---|---|---|---|---|
| 5,063,349 A | * | 11/1991 | Roemer et al. | 324/322 |
| 5,311,136 A | * | 5/1994 | Takahashi | 324/322 |
| 5,572,133 A | * | 11/1996 | Bunk | 324/322 |
| 7,714,583 B2 | * | 5/2010 | Zhu et al. | 324/322 |

FOREIGN PATENT DOCUMENTS

| | | |
|---|---|---|
| JP | 10-5189 | 1/1998 |
| JP | 2000-199782 | 7/2000 |
| JP | 2008-307309 | 12/2008 |

* cited by examiner

*Primary Examiner* — Louis Arana
(74) *Attorney, Agent, or Firm* — Nixon & Vanderhye PC (57) ABSTRACT

According to one embodiment, there is provided a magnetic resonance imaging apparatus in which a gradient field power supply apparatus supplies currents to gradient field coils corresponding to spatial coordinate axis directions to form gradient fields in a static field space which change along the respective spatial coordinate axis directions, the gradient field power supply apparatus includes a transformer configured to supply power supplied to a primary winding to a current output circuit via a plurality of secondary windings, with the number of phases of the primary windings being equal to or a multiple of the number of phases of the secondary windings, and the secondary windings of the respective phases of output channels corresponding to the respective spatial coordinate axis directions being wound around the primary windings of the respective phases.

15 Claims, 9 Drawing Sheets

GRADIENT FIELD POWER SUPPLY AND MAGNETIC RESONANCE IMAGING APPARATUS

CROSS-REFERENCE TO RELATED APPLICATIONS

This application is based upon and claims the benefit of priority from Japanese Patent Applications No. 2010-019596, filed Jan. 29, 2010; and No. 2011-013600, filed Jan. 26, 2011; the entire contents of both of which are incorporated herein by reference.

FIELD

Embodiments described herein relate generally to a gradient field power supply and a magnetic resonance imaging apparatus.

BACKGROUND

Each embodiment relates to the transformer and the like of a gradient field power supply used for a magnetic resonance imaging apparatus. A magnetic resonance imaging apparatus is an apparatus which visualizes the chemical and physical microscopic information of a substance or observes a chemical shift spectrum by using a phenomenon in which when a group of nuclei having a unique magnetic moment is placed in a uniform static field, they resonantly absorb the energy of a radio-frequency magnetic field that rotates at a specific frequency. Such a magnetic resonance imaging apparatus is very effective as a method of noninvasively obtaining an anatomical cross-sectional view of a human body. This apparatus is widely used as a diagnosis apparatus for a central nervous system such as the brain surrounded by the skull.

Such a magnetic resonance imaging apparatus includes gradient field coils, and a gradient field power supply apparatus for supplying currents to the gradient field coils as components of a mechanism for forming magnetic fields (gradient fields) whose strengths linearly change in the directions of spatial orthogonal axes (i.e., the x-, y-, z-axes).

Figure 10:
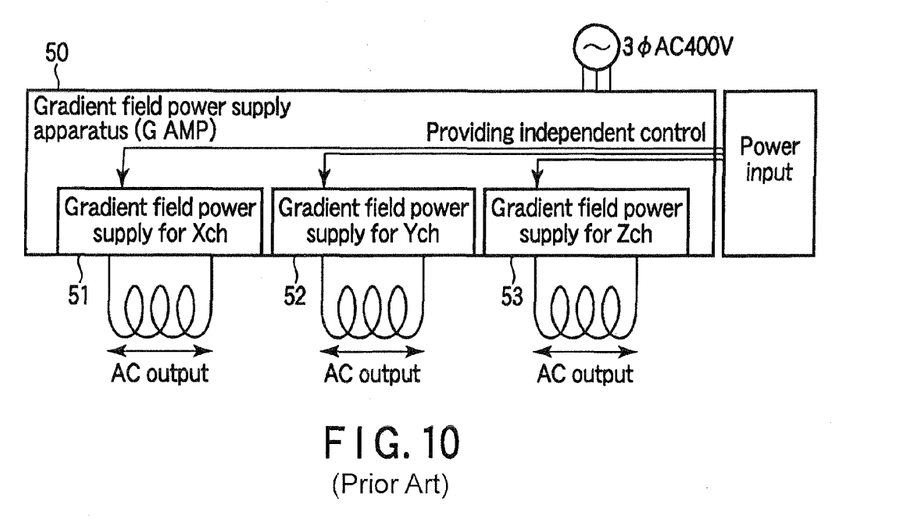
FIG. 10 is a view showing the arrangement of a conventional gradient field power supply apparatus.

FIG. 10 is a view showing the arrangement of a general gradient field power supply apparatus. As shown in FIG. 10, a gradient field power supply apparatus 50 includes an X-channel (Xch) gradient field power supply 51, a Y-channel (Ych) gradient field power supply 52, and a Z-channel (Zch) gradient field power supply 53. As the driving power supply of the gradient field power supply apparatus, for example, three-phase AC 400-V power is used. The power supply transformers in the gradient field power supply apparatus 50 transform and distribute the three-phase 400-V power supplied to the gradient field power supply apparatus 50 to supply the power to each of the gradient field power supplies 51, 52, and 53. The gradient field power supplies 51, 52, and 53 independently operate under the control of a control apparatus to supply currents to the gradient field coils for generating gradient fields in the corresponding coordinate axis directions.

Figure 11:
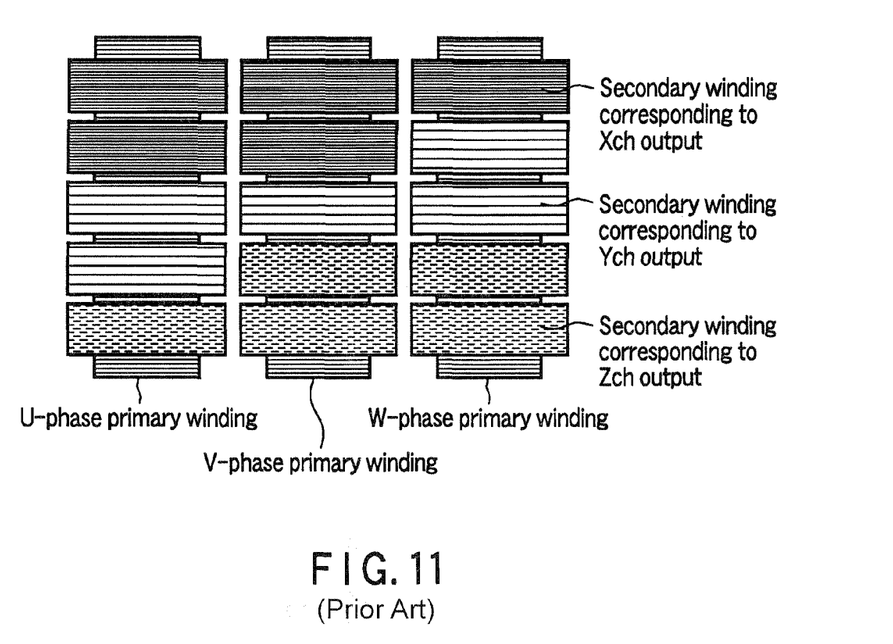
FIG. 11 is a view showing the arrangement of the transformer of a conventional gradient field power supply apparatus.

The conventional gradient field power supplies, however, have the following problems. That is, for example, as shown in FIG. 11, the power supply transformers of the gradient field power supply apparatus of the conventional magnetic resonance imaging apparatus have single-phase secondary windings wound around each of three-phase (U-phase, V-phase, and W-phase) primary windings. For example, as shown in FIG. 11, the single-phase secondary windings, i.e., the secondary windings corresponding to the respective channels, are not spatially uniformly arranged between the U-phase, V-phase, and W-phase (considering, for example, the X channel (Xch), the number of X-channel (Xch) secondary windings wound around the W-phase primary winding is smaller than that of X-channel (Xch) secondary windings wound around each of the U-phase and V-phase primary windings). Therefore, offsets occur in loads on the respective phases of the primary windings corresponding to the respective output channels, i.e., the X channel (Xch), Y channel (Ych), and Z channel (Zch). For this reason, offsets occur in a load on each phase of the primary winding corresponding to a specific output channel, resulting in an increase in voltage variations at the time of output.

In addition, with a recent tendency toward an increase in output current, the voltage of the gradient field power supply apparatus tends to frequently vary. For this reason, the magnetic field imaging apparatus has the function of protecting a subsequent stage by interlocking in accordance with the value of an output voltage. If, however, the width of voltage variation is large, it is impossible to execute any imaging method in which a voltage value exceeds a threshold for interlocking. When an imaging method like echo planar imaging (EPI) is executed, since a current concentratedly flows in the read channel, offsets tend to occur in the respective phases of the primary windings corresponding to a specific output channel.

There are provided a gradient field power supply apparatus which can supply power more stably than the prior art, even with the occurrence of offsets in output currents between output channels, by leveling power which the respective phases of the primary windings of the power supply transformer secure for the respective output channels, and a magnetic resonance imaging apparatus including the gradient field power supply apparatus.

DETAILED DESCRIPTION

In general, according to one embodiment, there is provided a magnetic resonance imaging apparatus in which a gradient field power supply apparatus supplies currents to gradient field coils corresponding to spatial coordinate axis directions to form gradient fields in a static field space which change along the respective spatial coordinate axis directions, the gradient field power supply apparatus comprising a transformer configured to supply power supplied to a primary winding to a current output circuit via a plurality of secondary windings, with the number of phases of the primary windings being equal to or a multiple of the number of phases of the secondary windings, and the secondary windings of the respective phases of output channels corresponding to the respective spatial coordinate axis directions being wound around the primary windings of the respective phases.

The embodiments will be described below with reference to the views of the accompanying drawing. Note that the same reference numerals in the following description denote constituent elements having almost the same functions and arrangements, and a repetitive description will be made only when required.

Figure 1:
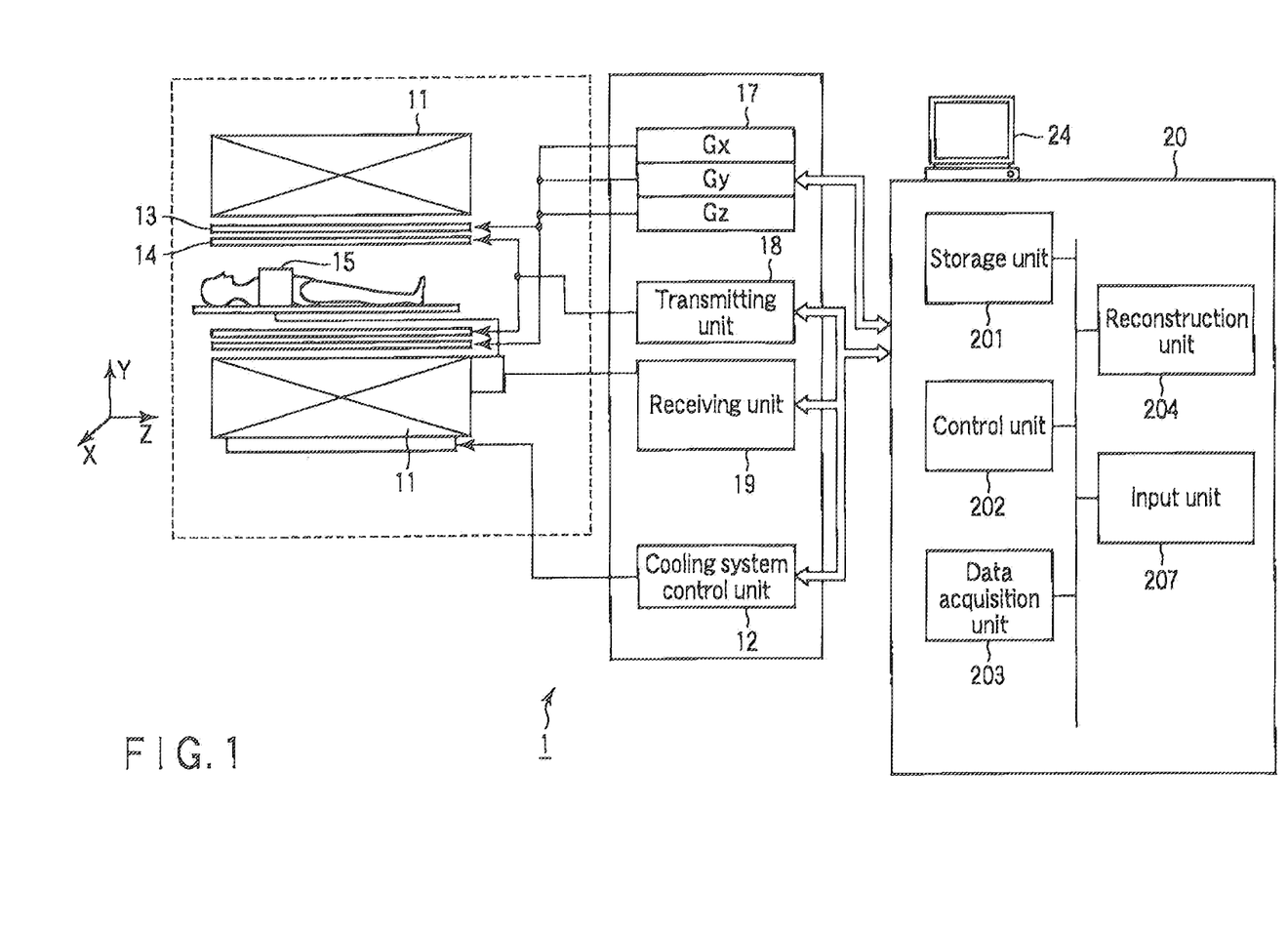
FIG. 1 is a block diagram showing the arrangement of a magnetic resonance imaging apparatus 1 according to this embodiment.

FIG. 1 is a block diagram showing the arrangement of a magnetic resonance imaging apparatus 1 according to an embodiment. As shown in FIG. 1, the magnetic resonance imaging apparatus 1 includes a static field magnet 11, a cooling system control unit 12, gradient field coils 13, a radio-frequency transmission coil 14, a radio-frequency reception coil 15, a transmitting unit 18, a receiving unit 19, a data processing unit 20, and a display unit 24.

The static field magnet 11 is a magnet which generates a static field. This magnet generates a uniform static field.

The cooling system control unit 12 controls a cooling mechanism for the static field magnet 11.

Each gradient field coil 13 is provided, for each of the X-, Y-, and Z-axis directions, inside the static field magnet 11 and is shorter than the static field magnet 11. Each gradient field coil 13 forms an independent output channel, and converts a pulse current supplied from a gradient field power supply apparatus 17 into a gradient field. The gradient field generated by each gradient field coil 13 specifies a signal generating portion (position).

Assume that the Z-axis direction is set to be the same direction as that of a static field in this embodiment. Assume also that in this embodiment, the gradient field coil 13 and the static field magnet 11 have cylindrical shapes. The gradient field coil 13 is placed in a vacuum by a predetermined support mechanism. This arrangement is made in consideration of low noise to prevent the vibrations of the gradient field coil 13 which are generated upon application of pulse currents from being transmitted as sound waves to the outside.

The radio-frequency transmission coil (RF transmission coil) 14 is a coil for applying radio-frequency pulses to an imaging region of an object to generate magnetic resonance signals. The radio-frequency transmission coil 14 is a whole-body RF coil, which can also be used as a reception coil when, for example, an abdominal region or the like is to be imaged.

A radio-frequency reception coil (RE reception coil) 15 is a coil which is placed near the object, and preferably in contact with the object so as to hold it, and receives magnetic resonance signals from the object. In general, the radio-frequency reception coil 15 has a shape specialized for each region.

Note that FIG. 1 has exemplified a cross-coil system including a radio-frequency transmission coil and a radio-frequency reception coil as discrete components. However, the present invention may use a single coil system including one coil having these functions.

The gradient field power supply apparatus 17 generates a pulse current for forming a gradient field and supplies the current to each gradient field coil 13. Note that the detailed arrangement of the gradient field power supply apparatus 17 will be described later.

The transmitting unit 18 includes an oscillating unit, phase selecting unit, frequency conversion unit, amplitude modulating unit, and radio-frequency power amplifying unit (none of which are shown), and transmits radio-frequency pulses corresponding to a Larmor frequency to the radio-frequency coil for transmission. The magnetization of a predetermined nucleus of the object is excited by the radio-frequency wave generated from the radio-frequency transmission coil 14 upon this transmission.

The receiving unit 19 includes an amplifying unit, intermediate frequency conversion unit, phase detecting unit, filter, and A/D converter (none of which are shown). The receiving unit 19 performs amplification processing, intermediate frequency conversion processing using an oscillation frequency, phase detection processing, filter processing, and A/D conversion processing for the magnetic resonance signal (radio-frequency signal) which is emitted when the magnetization of the nucleus relaxes from the excited state to the ground state and received from the radio-frequency transmission coil 14.

The display unit 24 displays a magnetic resonance image, a predetermined scan screen, and the like.

The data processing unit 20 is a computer system which generates a magnetic resonance image by processing received data, and includes a storage unit 201, a control unit 202, a data acquisition unit 203, a reconstruction unit 204, a signal correction unit 205, and an input unit 207.

The storage unit 201 stores acquired magnetic resonance images, programs for executing various scan sequences (e.g., a scan sequence for executing, for example, EPI (Echo Planar Imaging)), and the like.

The control unit 202 includes a CPU and a memory (none of which are shown), and serves as a main unit for the overall system to statically or dynamically control this magnetic resonance imaging apparatus. In particular, the control unit 202 controls the gradient field power supply apparatus 17 and the like when executing a scan sequence like echo planar imaging (EPI) or the like.

The data acquisition unit 203 acquires the digital signals sampled by the receiving unit 19.

The reconstruction unit 204 executes post-processing, i.e., reconstruction such as a Fourier transform, for the data acquired by the data acquisition unit 203 to obtain the spectrum data or image data of a desired nuclear spin inside the object.

The input unit 207 includes input devices (a mouse, trackball, mode switch, keyboard, and the like) for inputting various commands, instructions, and information from the operator.

The display unit 24 is an output unit to display spectrum data, image data, or the like input from the data processing unit 20.

(Gradient Field Power Supply Apparatus)

The gradient field power supply apparatus 17 of the magnetic resonance imaging apparatus 1 will be described in detail next.

Figure 2:
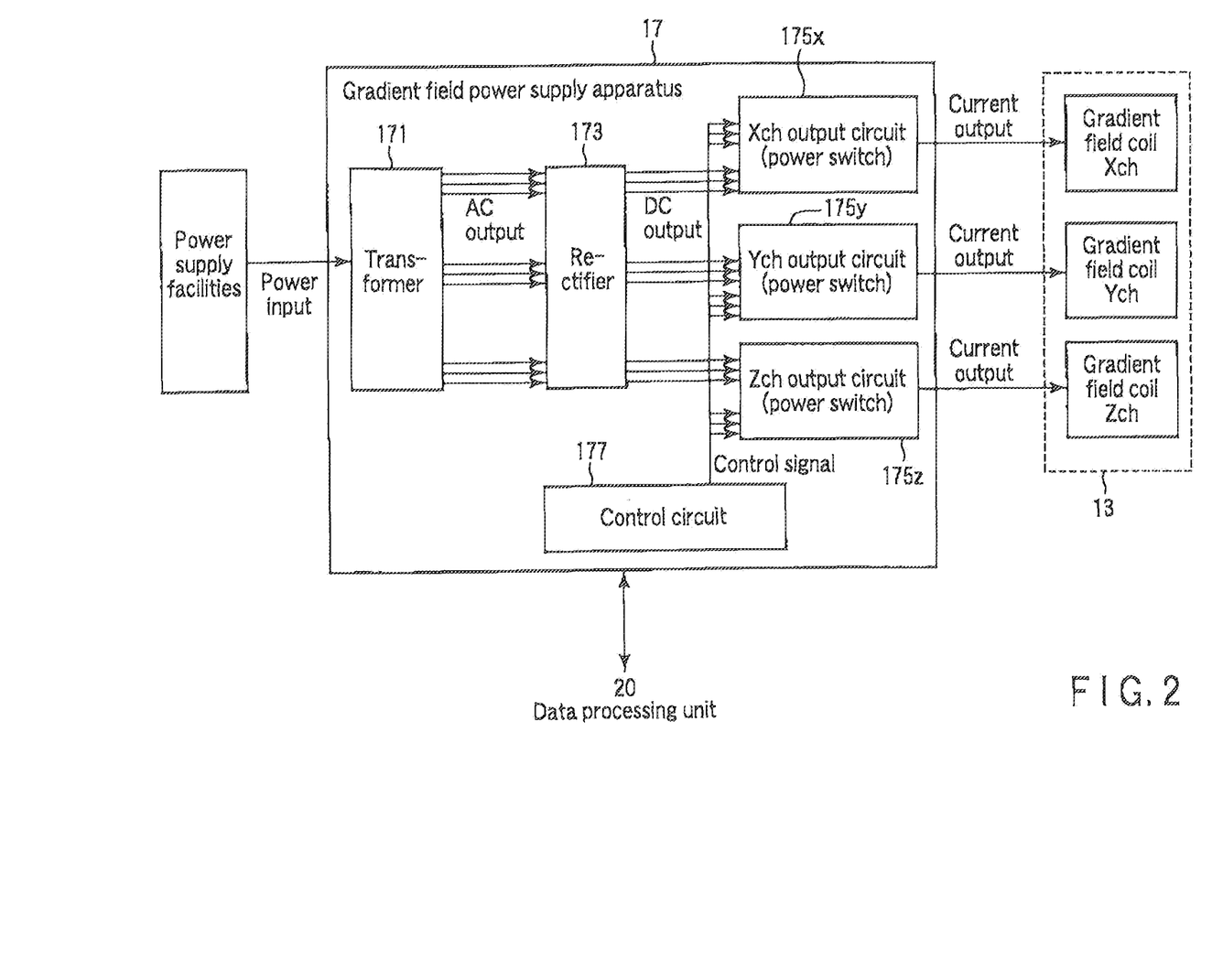
FIG. 2 is a block diagram for explaining the arrangement of a gradient field power supply apparatus 17.

FIG. 2 is a block diagram for explaining the arrangement of the gradient field power supply apparatus 17. As shown in FIG. 2, the gradient field power supply apparatus 17 includes a transformer 171, a rectifier 173, an Xch output circuit (Xch power switch) 175$x$, a Ych output circuit (Ych power switch) 175$y$, a Zch output circuit (Zch power switch) 175$z$, and a control circuit 177.

Figure 3:
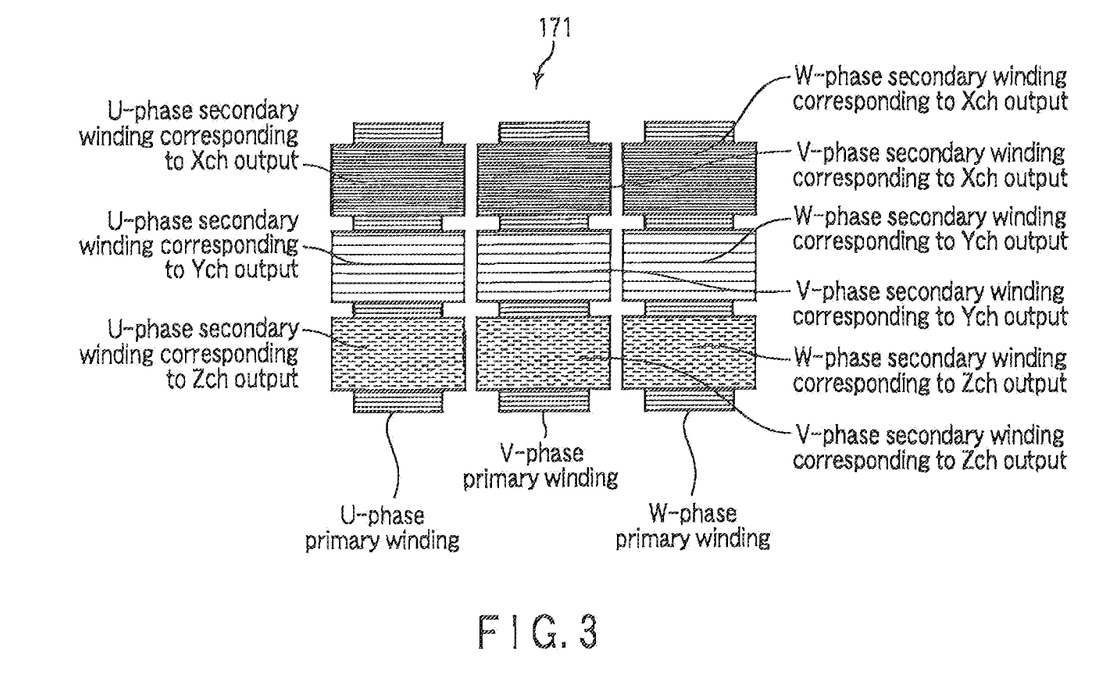
FIG. 3 is a view showing an example of the arrangement of a transformer 171 of the gradient field power supply apparatus 17.

The transformer 171 has secondary windings of which the number of phases is equal to or a multiple of the number of phases of primary windings. For the sake of concreteness, the following description will exemplify a case in which the number of phases is equal to the number of phases of primary windings. The secondary windings corresponding to the respective phases are wound around primary windings of the respective phases, and dispersed and arranged for the respective output channels. For the sake of a concrete description, assume that in this embodiment, the number of phases is three, i.e., the U phase, V phase, and W phase. For example, as shown in FIG. 3, the transformer 171 includes U-phase secondary windings respectively corresponding to the Xch output, Ych output, and Zch output which are wound around a U-phase primary winding. Likewise, the transformer 171 includes V-phase secondary windings respectively corresponding to the Xch output, Ych output, and Zch output which are wound around a V-phase primary winding. The transformer 171 also includes W-phase secondary windings respectively corresponding to the Xch output, Ych output, and Zch output which are wound around a W-phase primary winding.

Note that the number of phases is not limited to three as in the above case, and the technical idea of the present embodiment can be applied to any case regardless of the number of phases as long as primary windings are equal in the number of phases to secondary windings.

The rectifier 173 generates a DC voltage and DC current from the AC power output from the transformer 171.

The Xch output circuit 175$x$, Ych output circuit 175$y$, and Zch output circuit 175$z$ respectively output DC powers from the rectifier 173 as pulse currents to the gradient field coils of the corresponding channels at predetermined timings in accordance with control signals from the control circuit 177.

The control circuit 177 performs control associated with current outputs from the Xch output circuit 175$x$, the Ych output circuit 175$y$, and the Zch output circuit 175$z$ to the gradient field coils of the corresponding channels under the control of the control unit 202.

As in the above case, in the transformer 171 of the gradient field power supply apparatus 17, the number of phases of the secondary windings are equal to that of the primary windings (three in this case), and the secondary windings of the respective phases are wound around the primary windings of the respective phases. Therefore, even with offsets in output currents between output channels, it is possible to prevent the occurrence of offsets in loads on the respective phases of the primary windings.

Note that the form of the arrangement of secondary windings equal in the number of phases to primary windings is not limited to the case shown in FIG. 3, and various forms are conceivable. Secondary winding arrangement variations will be described below in accordance with the following embodiments.

First Embodiment

The arrangement form of secondary windings according to the first embodiment has a plurality of secondary windings of each phase are wound around a corresponding one of the primary windings corresponding to the respective phases.

Figure 4:
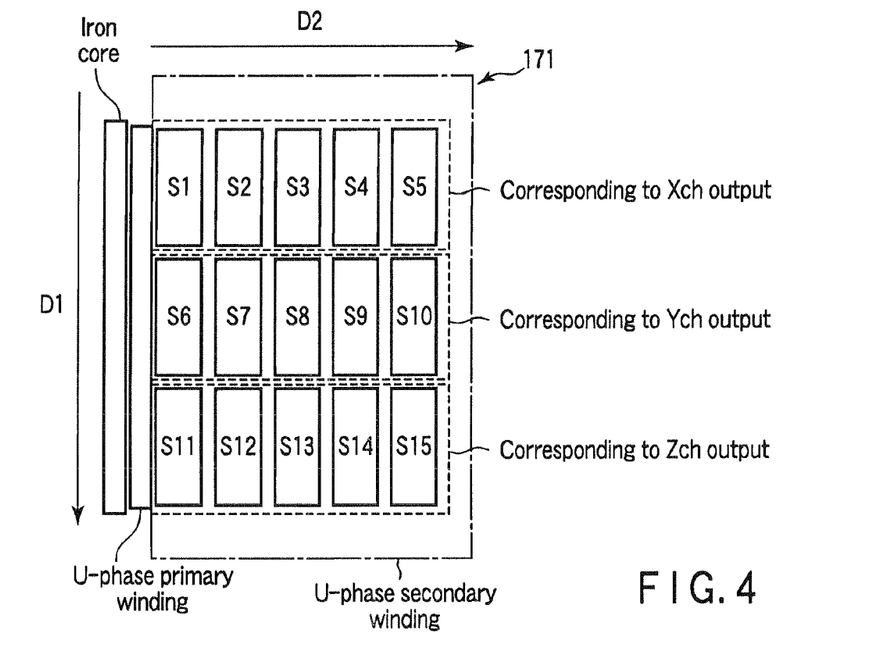
FIG. 4 is a view for explaining the first embodiment.

FIG. 4 is a view for explaining this embodiment, in which, for example, five each of U-phase secondary windings respectively corresponding to the Xch output, Ych output, and Zch output (five each of circuits) are arranged along the concentric direction (winding direction) in correspondence with the U-phase primary winding. The arrangement of the secondary windings for the V-phase primary winding and that of the secondary windings for the W-phase primary winding are the same as that described above.

According to this arrangement, the same number (five in the case shown in FIG. 4) of each of the secondary windings corresponding to the U phase, V phase, and W phase are wound around each of the primary windings corresponding to the U phase, V phase, and W phase. Equalizing the numbers of secondary windings corresponding to the Xch output, Ych output, and Zch output for the respective primary windings respectively corresponding to the U phase, V phase, and W phase in this manner can level the powers which the primary windings of the respective phases secure for the secondary windings corresponding to the respective outputs. This makes it possible to apply stable secondary-side voltages without any offsets in loads on the primary windings even with offsets in output currents between the output channels.

Second Embodiment

In general, electromagnetic interaction occurs between secondary windings in addition to the electromagnetic interaction between primary windings and secondary windings. In the case of such electromagnetic interactions not being complete, if there is a channel whose load is heavy and in which a large current flows and a channel whose load is light and in which no large current flows, the voltage on a secondary winding corresponding to the channel whose load is light may exceed an allowable voltage. In order to solve this problem, the arrangement of the secondary windings according to the second embodiment is configured to level the magnetic coupling between the secondary windings corresponding to the respective output channels when the secondary windings are wound around each of the primary windings corresponding to the respective phases.

Figure 5:
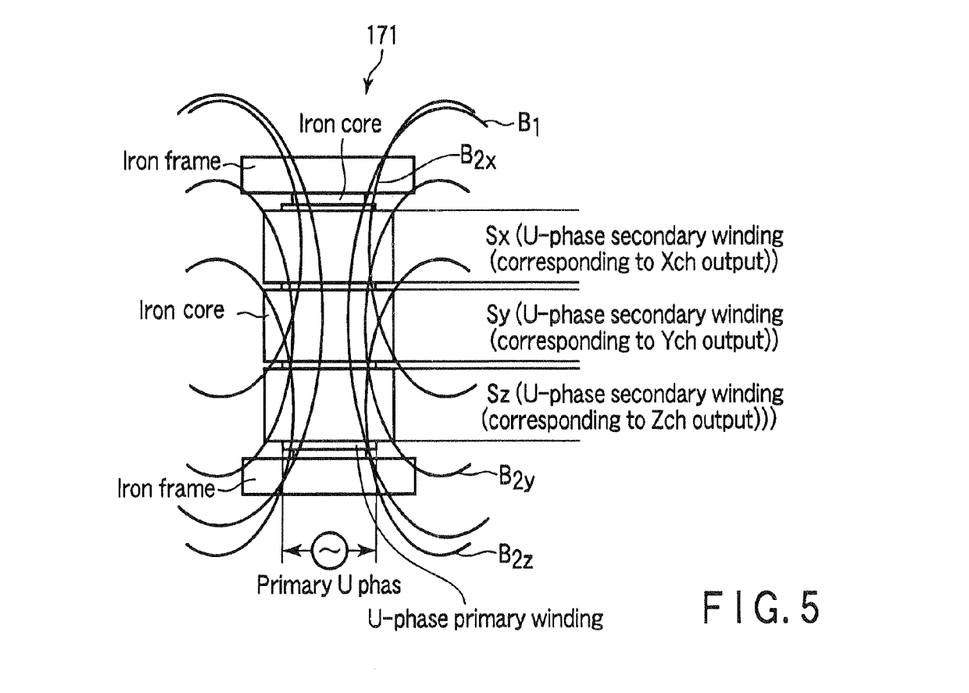
FIG. 5 is a view for explaining the magnetic coupling between U-phase secondary windings corresponding to the X channel, Y channel, and Z channel when one each of the respective types of secondary windings is wound around a U-phase primary winding.

FIG. 5 is a view for explaining the magnetic coupling between U-phase secondary windings corresponding to the Xch output, Ych output, and Zch output when one each of the respective types of secondary windings is wound around a U-phase primary winding.

As shown in FIG. 5, a secondary winding Sy (corresponding to Ych) is wound around a central portion of a U-phase primary winding, a secondary winding Sx (corresponding to Xch) is wound around one end side of the U-phase primary winding, and a secondary winding Sz (corresponding to Zch) is wound around the other end side of the U-phase primary winding.

In the arrangement of secondary windings shown in FIG. 5, when the X channel (Xch) is selected as an output channel, a current is supplied to only the secondary winding Sx, while only small amounts of currents are supplied to the other two secondary windings, i.e., the secondary windings Sy and Sz. Therefore, a magnetic flux B1 formed by the U-phase primary winding mainly couples with a magnetic flux B2$x$ formed by the secondary winding Sx locally located on the U-phase primary winding. In addition, leakage magnetic fluxes are conceivable between the secondary winding Sx and the secondary winding Sz.

When a current disproportionately flows only in secondary winding Sx in this manner, for example, the output voltage of secondary winding Sz corresponding to the Z channel sometimes unintentionally rises due to the influences of leakage magnetic fluxes. This is because the magnetic flux in secondary winding Sz is generated in order to cancel out the magnetic flux in the primary winding which is generated due to the cancellation of an increase of the magnetic flux caused by the current flowing in secondary winding Sx. (Ideally, an increase of the magnetic flux in the iron core generated by an increase of the current in secondary winding Sx should be canceled by an increase of the magnetic flux in the primary winding. Actually, however, the increase of the magnetic flux in the primary winding does not completely cancel the increase of the magnetic flux in secondary winding Sx at the position where secondary winding Sz is located, due to leakage magnetic fluxes between secondary winding Sx and secondary winding Sz. As a result, the magnetic flux in secondary winding Sz is generated, and the voltage across secondary winding Sz increases. Such a phenomenon also occurs in secondary winding Sx when a current disproportionately flows only in secondary winding Sz (when a current disproportionately flows only in secondary winding Sy, such a phenomenon reduces because secondary winding Sy is located sufficiently near to secondary windings Sx and Sz and equidistant from secondary windings Sx and Sz).

Figure 6A:
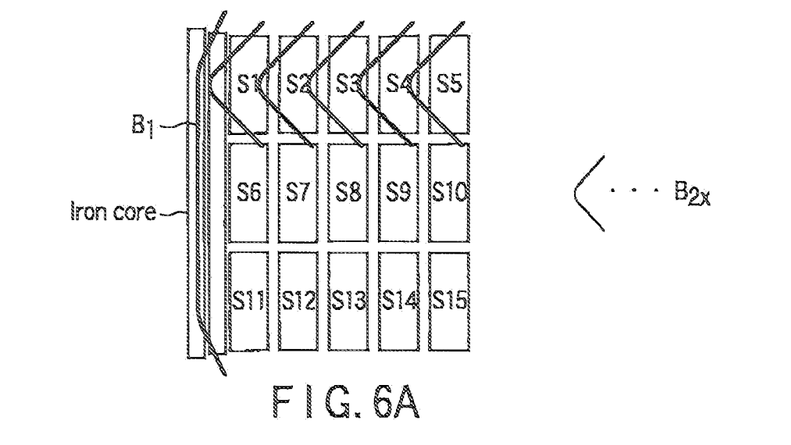
FIGS. 6A, 6B, and 6C are views for explaining the magnetic coupling between U-phase secondary windings respectively corresponding to the X channel, Y channel, and Z channel when five each of the respective types of secondary windings are wound around a U-phase primary winding.
Figure 6B:
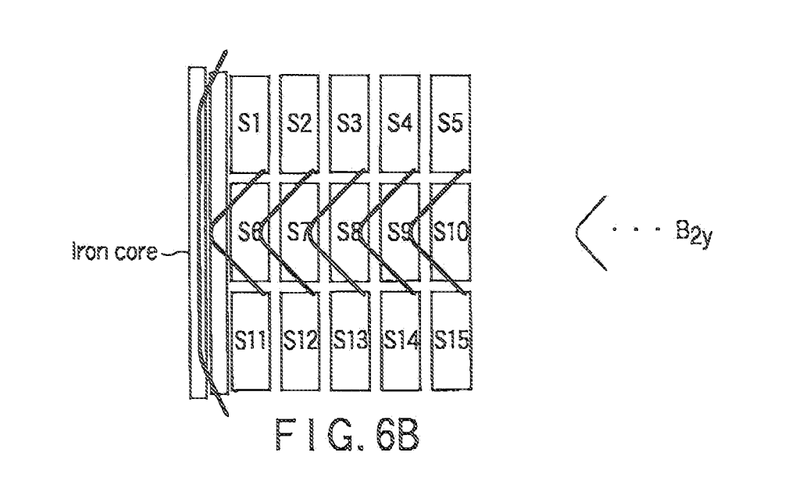
Figure 6C:
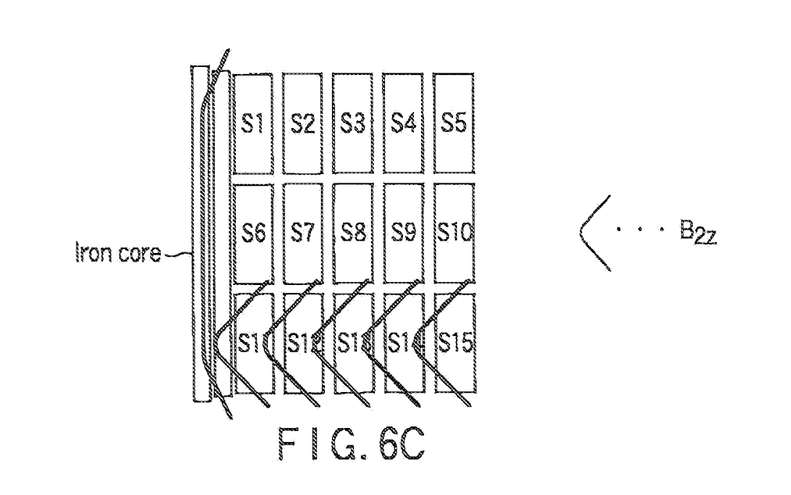

FIGS. 6A, 6B, and 6C are views for explaining magnetic coupling in the arrangement of the secondary windings shown in FIG. 4 (that is, the arrangement in which five each of secondary windings of the respective phases are wound around each of primary windings corresponding to the respective phases). In the arrangement shown in FIGS. 6A, 6B, and 6C, a magnetic flux B1 formed by the primary winding is widely distributed relative to the iron core, whereas the magnetic fluxes formed by the secondary windings connected to a specific output channel are locally distributed relative to the iron core. For this reason, when the X channel is selected as an output channel, the output voltages of the secondary windings corresponding to other channels rise as in the case shown in FIG. 5

Such a rise in the output voltage of the secondary winding Sz is not generally an intentional behavior, and makes the output voltage unstable. The gradient field power supply apparatus of the magnetic resonance imaging apparatus is provided with an interlocking function with the value of an output voltage for circuit protection of the subsequent stage. If the width of voltage variation is large and a voltage value exceeds a threshold for interlocking, it is impossible to execute imaging. This problem becomes especially noticeable when large power is supplied in a specific axial direction (the readout (RO) direction in the case shown in FIGS. 6A, 6B, and 6C), which is typified echo planar imaging (EPI) like that shown in FIG. 7, because larger offsets occur in currents flowing on the secondary windings between the secondary windings for the respective axes.

Such a rise in the output voltage of the secondary winding Sz is not generally an intentional behavior, and makes the output voltage unstable. The gradient field power supply apparatus of the magnetic resonance imaging apparatus is provided with an interlocking function with the value of an output voltage for the protection of the circuit on the subsequent stage. If the width of voltage variation is large and a voltage value exceeds a threshold for interlocking, it is impossible to execute imaging. This problem becomes especially noticeable when large power is supplied in a specific axial direction (the readout (RO) direction in the case shown in FIGS. 6A, 6B, and 6C), which is typified echo planar imaging (EPI) like that shown in FIG. 7, because larger offsets occur in currents flowing on the secondary windings between the secondary windings for the respective axes.

Figure 7:
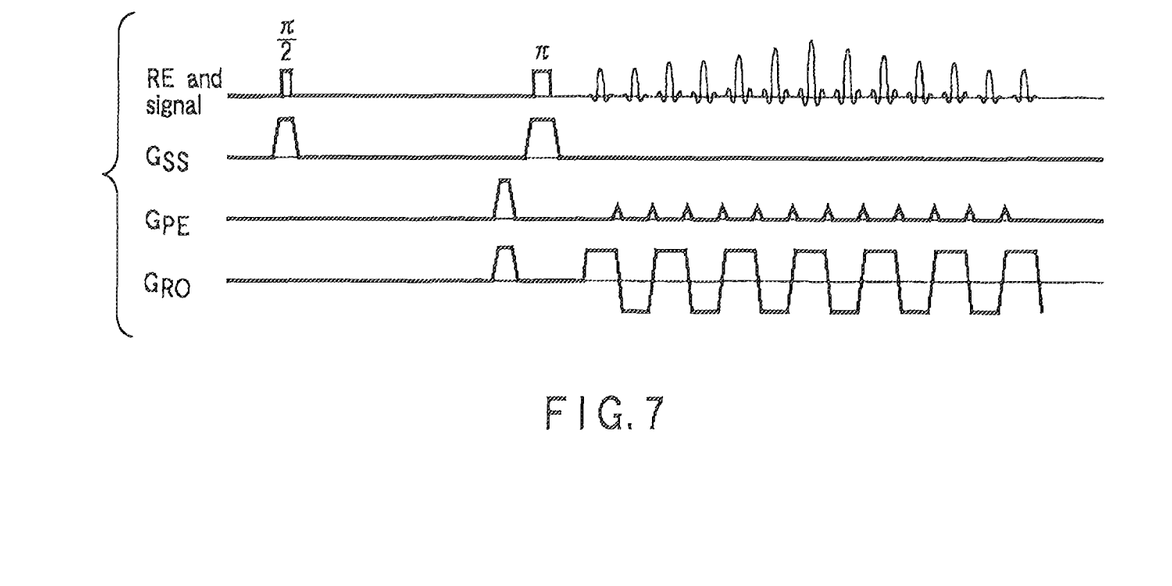
FIG. 7 is a chart showing an example of a scan sequence for echo planar imaging (EPI)

In this case, echo planar imaging is an imaging sequence of applying an excitation RF pulse, simultaneously applying a slice gradient field (SE axis) to selectively excite magnetization within a slice plane, applying a re-convergence RF pulse, switching and applying a readout gradient field (RO axis) in a direction parallel to the slice plane a plurality of numbers of times, and simultaneously applying a phase encoding gradient field (PE axis) in a direction which is parallel to the slicing gradient field and perpendicular to the readout gradient field. Note that a re-convergence RF pulse may not be applied, as needed.

Obviously, an imaging sequence of supplying large power to a specific channel is not limited to echo planar imaging. For example, other examples of imaging include a fast Fourier method and diffusion weighted imaging. The fast Fourier method differs from the EPI method in that a phase encoding gradient field is applied in the form of pulses every time a readout gradient field is inverted. Diffusion weighted imaging is a sequence of applying MPG (Motion Probing Gradient) pulses in an EPI sequence. When, for example, a spin echo type EPI method is to be used, MPG pulses are applied before and after the application of a re-convergence RF pulse.

In order to implement more suitable imaging in these imaging sequences and the like, the arrangement form of secondary windings according to the second embodiment is configured such that the secondary windings of the respective phases are spatially dispersed and arranged for each of primary windings corresponding to the respective phases so as to prevent the secondary windings which generates leakage magnetic fields from concentrating for each channel.

Figure 8:
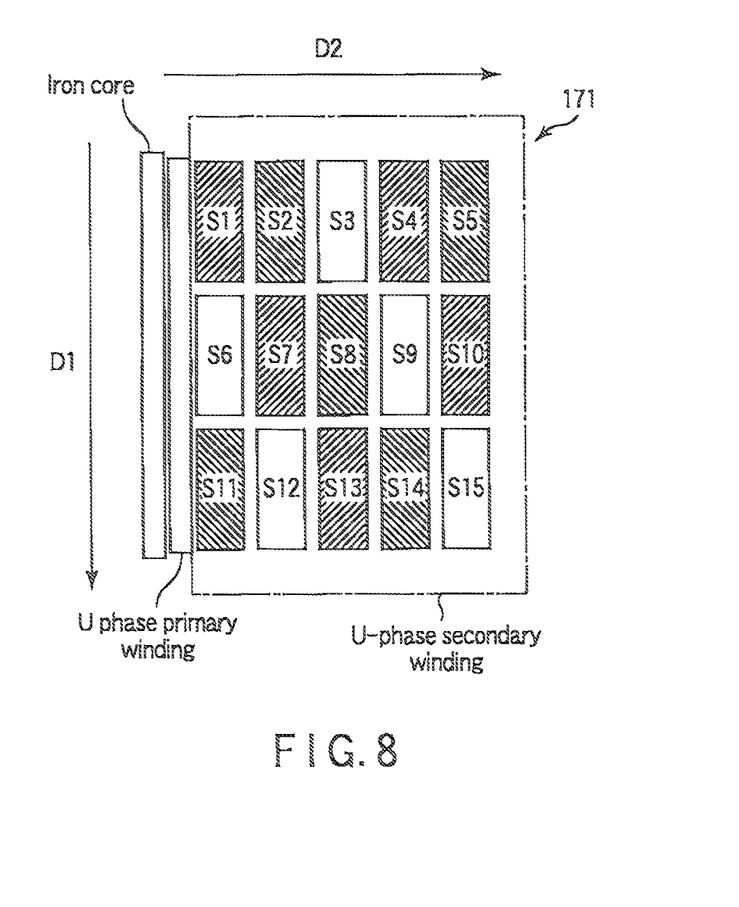
FIG. 8 is a view showing an example of a transformer obtained by winding five each of secondary windings corresponding to the respective channels around each primary winding corresponding to each phase, with the respective secondary windings being dispersed/arranged.

FIG. 8 is a view showing an example of a transformer in which secondary windings corresponding to each channel are dispersed and arranged when, for example, five each of secondary windings of the respective phases are wound around a U-phase primary winding. As shown in FIG. 8, secondary windings S1, S7, S13, S4, and S10 are connected to the X channel, secondary windings S6, S12, S3, S9, and S15 are connected to the Y channel, and secondary windings S11, S2, S8, S14, and S5 are connected to the Z channel. That is, a plurality of secondary windings corresponding to outputs from the respective channels are arranged for each of primary windings corresponding to the respective phases so as to be mingled in a core direction (axial direction) D1 of the iron core (at least one secondary winding corresponding to an output from each channel is arranged in the core direction D1). In addition, a plurality of secondary windings corresponding to outputs from the respective channels are arranged in a concentric direction D2 in a mixed manner (at least one secondary winding corresponding to an output from each channel is arranged in the concentric direction D2).

Figure 9A:
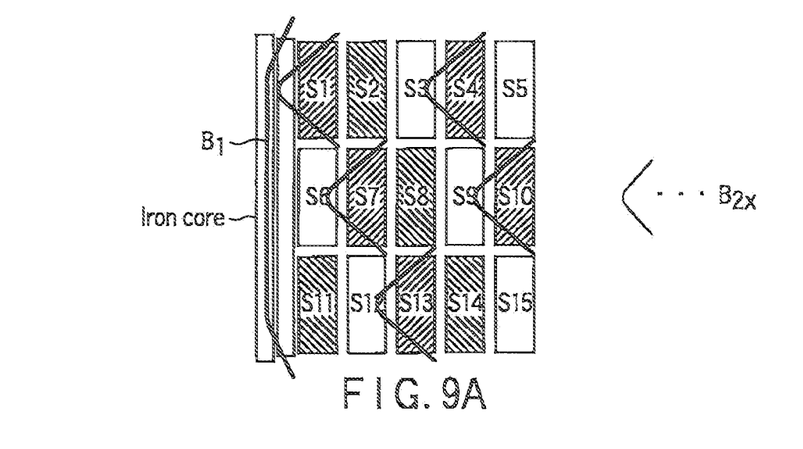
FIGS. 9A, 9B, and 9C are views showing how magnetic coupling occurs when the secondary windings are dispersed/arranged as shown in FIG. 8.
Figure 9B:
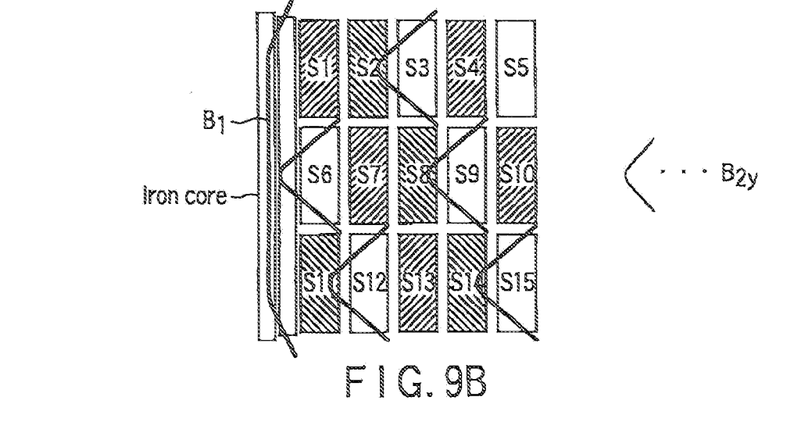
Figure 9C:
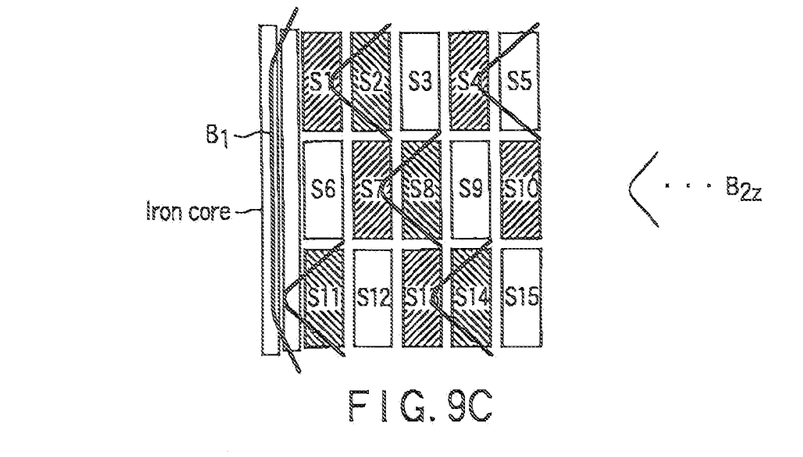

FIGS. 9A, 9B, and 9C respectively show a magnetic flux B2x on the secondary winding side when an output channel is the X channel, a magnetic flux B2y on the secondary winding side when an output channel is the Y channel, and a magnetic flux B2z on the secondary winding side when an output channel is the Z channel, in a case in which the above array/connection form is used. Therefore, leveling leakage magnetic fluxes corresponding to each output channel between secondary windings in the core direction D1 can level portions in which the magnetic coupling is weak. This makes it possible to provide stable gradient field power supply outputs with little voltage variations in the outputs even with offsets in output currents between output channels.

(Effects)

The following effects can be obtained according to the above arrangement.

This magnetic resonance imaging apparatus uses the arrangement in which the number of primary windings and the number of secondary windings of the transformer used in the gradient field power supply apparatus are set to be same, and the secondary windings of the respective phases are wound around each of the primary windings corresponding to the respective phases. Therefore, even with offsets in output currents and output voltages between output channels, it is possible to prevent loads from been disproportionately imposed on the primary windings corresponding to the respective phases. This makes it possible to level powers which the primary windings of the respective phases secure for the respective output channels and stably provide powers as compared with the prior art.

In addition, according to this magnetic resonance imaging apparatus, substantially equalizing the numbers of secondary windings corresponding to outputs from the respective channels in the concentric direction for each of the primary windings corresponding to the respective phases can level the powers which the primary windings of the respective phases secure for the secondary windings corresponding to the respective outputs. This makes it possible to apply stable secondary-side voltages without any offsets in loads on the primary windings even with offsets in output currents between the output channels.

Furthermore, according to this magnetic resonance imaging apparatus, at least one of secondary windings corresponding to the respective channels is arranged for each of the primary windings corresponding to the respective phases in the core direction D1, and at least one secondary winding corresponding to each channel is arranged in the concentric direction D2. Therefore, leveling leakage magnetic fluxes between secondary windings corresponding to each output channel in the core direction can level portions in which the magnetic coupling is weak. This makes it possible to provide stable gradient field power supply outputs with little voltage variations in the outputs even with offsets in output currents between output channels.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus in which a gradient field power supply apparatus supplies currents to gradient field coils corresponding to spatial coordinate axis directions to form gradient fields in a static field space which change along the respective spatial coordinate axis directions, the gradient field power supply apparatus comprising a transformer configured to supply power supplied to a primary winding to a current output circuit via a plurality of secondary windings, with the number of phases of the primary windings being equal to or a multiple of the number of phases of the secondary windings, and the secondary windings of the respective phases of output channels corresponding to the respective spatial coordinate axis directions being wound around the primary windings of the respective phases.

2. The apparatus according to claim 1, wherein a plurality of secondary windings of each phase corresponding to the output channel are wound around the primary winding corresponding to each of the phases.

3. The apparatus according to claim 2, wherein the plurality of secondary windings of the respective phases are spatially dispersed and arranged relative to the primary windings corresponding to the respective phases.

4. The apparatus according to claim 2, wherein the plurality of secondary windings of the respective phases are arranged in a mixed manner in a core direction of the primary winding corresponding to each of the phases.

5. The apparatus according to claim 4, wherein the plurality of secondary windings of the respective phases are arranged in a mixed manner in a concentric direction of the primary winding corresponding to each of the phases.

6. The apparatus according to claim 2, wherein at least one of the secondary windings corresponding to the respective output channels is arranged in the core direction of the primary winding of each of the phases.

7. The apparatus according to claim 6, wherein at least one of the secondary windings corresponding to the respective output channels is arranged in the concentric direction of the primary winding of each of the phases.

8. The apparatus according to claim 2, further comprising a control unit configured to supply a current to each gradient field coil corresponding to each axial direction by using each phase of a secondary winding, of the plurality of secondary windings of the respective phases arranged to be spatially dispersed, which corresponds to an output channel corresponding to a readout direction.

9. A gradient field power supply apparatus used for a magnetic resonance imaging apparatus which supplies currents to gradient field coils corresponding to spatial coordinate axis directions to form gradient fields in a static field space which change along the respective spatial coordinate axis directions, the apparatus comprising
a transformer configured to supply power supplied to a primary winding to a current output circuit via a plurality of secondary windings, with the number of phases of the primary windings being equal to or a multiple of the number of phases of the secondary windings, and the secondary windings of the respective phases of output channels corresponding to the respective spatial coordinate axis directions being wound around the primary windings of the respective phases.

10. The apparatus according to claim 9, wherein a plurality of secondary windings of each phase corresponding to the output channel are wound around the primary winding corresponding to each of the phases.

11. The apparatus according to claim 10, wherein the plurality of secondary windings of the respective phases are spatially dispersed and arranged relative to the primary windings corresponding to the respective phases.

12. The apparatus according to claim 10, wherein the plurality of secondary windings of the respective phases are arranged in a mixed manner in a core direction of the primary winding corresponding to each of the phases.

13. The apparatus according to claim 12, wherein the plurality of secondary windings of the respective phases are arranged in a mixed manner in a concentric direction of the primary winding corresponding to each of the phases.

14. The apparatus according to claim 10, wherein at least one of the secondary windings corresponding to the respective output channels is arranged in the core direction of the primary winding of each of the phases.

15. The apparatus according to claim 14, wherein at least one of the secondary windings corresponding to the respective output channels is arranged in the concentric direction of the primary winding of each of the phases.

* * * * *